US010475824B2

(12) United States Patent
Ren et al.

(10) Patent No.: US 10,475,824 B2
(45) Date of Patent: Nov. 12, 2019

(54) DISPLAY PANEL, ITS MANUFACTURING METHOD, AND DISPLAY DEVICE (71) Applicant: BOE TECHNOLOGY GROUP CO., LTD., Beijing (CN)

(72) Inventors: Qingrong Ren, Beijing (CN); Woobong Lee, Beijing (CN); Fengchao Wang, Beijing (CN); Jianming Sun, Beijing (CN); Yingwei Liu, Beijing (CN); Wei Yang, Beijing (CN); Dongsheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/972,096

(22) Filed: May 4, 2018

(65) Prior Publication Data
US 2019/0019813 A1    Jan. 17, 2019

(30) Foreign Application Priority Data
Jul. 11, 2017    (CN) .......................... 2017 1 0564758

(51) Int. Cl.
*H01L 27/12* (2006.01)
*H01L 27/146* (2006.01)
(Continued)

(52) U.S. Cl.
CPC ........ *H01L 27/124* (2013.01); *H01L 27/1225* (2013.01); *H01L 27/1262* (2013.01);
(Continued)

(58) Field of Classification Search
CPC ............. H01L 27/124; H01L 27/14663; H01L 27/14636; H01L 27/14616; H01L 27/14685; H01L 31/022475; H01L 27/1262; H01L 27/1225; H01L 27/14692; H01L 27/14678; H01L 29/7869
See application file for complete search history.

(56) References Cited

U.S. PATENT DOCUMENTS

2004/0262614 A1*  12/2004  Hack .................... G09G 3/3258
                                                                257/79
2010/0091149 A1*   4/2010  Weisfield .......... H01L 27/14692
                                                                348/294
(Continued)

FOREIGN PATENT DOCUMENTS

CN          103730533 A      4/2014
CN          105093654 A      11/2015

OTHER PUBLICATIONS

First Chinese Office Action dated May 24, 2019, received for corresponding Chinese Application No. 201710564758.1.

*Primary Examiner* — Su C Kim
(74) *Attorney, Agent, or Firm* — Kinney & Lange, P.A.

(57) ABSTRACT

The present disclosure provides a display panel, its manufacturing method and a display device. The manufacturing method of the display panel comprises: forming, on a substrate, a thin film transistor comprising a gate electrode, an active layer, a source electrode and a drain electrode; forming a hydrogen diffusion barrier layer that covers the entire substrate, wherein the hydrogen diffusion barrier layer is electrically conductive and is electrically connected to the drain electrode; and forming a photosensitive structure layer on the hydrogen diffusion barrier layer.

17 Claims, 7 Drawing Sheets

(51) Int. Cl.
*H01L 31/0224* (2006.01)
*H01L 29/786* (2006.01)

(52) U.S. Cl.
CPC .. *H01L 27/14616* (2013.01); *H01L 27/14636* (2013.01); *H01L 27/14663* (2013.01); *H01L 27/14685* (2013.01); *H01L 27/14692* (2013.01); *H01L 31/022475* (2013.01); *H01L 27/14678* (2013.01); *H01L 29/7869* (2013.01)

(56) References Cited

U.S. PATENT DOCUMENTS

| | | |
|---|---|---|
| 2014/0103347 A1 | 4/2014 | Ishino |
| 2016/0079286 A1* | 3/2016 | Jin .................... H01L 29/66742 257/71 |
| 2016/0190202 A1* | 6/2016 | Fujiwara ........... H01L 27/14632 257/43 |
| 2016/0322416 A1 | 11/2016 | Nara |
| 2017/0170251 A1* | 6/2017 | Moon ................. H01L 27/3262 |
| 2017/0248827 A1 | 8/2017 | Zhang |

* cited by examiner

| S1 | Forming, on a substrate, a thin film transistor comprising a gate electrode, an active layer, a source electrode and a drain electrode; |
| S2 | Forming a hydrogen diffusion barrier layer that covers the entire substrate, wherein the hydrogen diffusion barrier layer is electrically conductive and is electrically connected to the drain |
| S3 | Forming a photosensitive structure layer on the hydrogen diffusion barrier layer. |

Fig. 17

DISPLAY PANEL, ITS MANUFACTURING METHOD, AND DISPLAY DEVICE

CROSS-REFERENCE TO RELATED APPLICATION

This application claims a priority to Chinese Patent Application No. 201710564758.1 filed on Jul. 11, 2017, the disclosures of which are incorporated in their entirety by reference herein.

TECHNICAL FIELD

The present disclosure relates to the field of display technology, in particular to a display panel, its manufacturing method, and a display device comprising the display panel.

BACKGROUND

In recent years, the combination of thin film transistor (TFT) active addressing technology and the photodiode which is a photosensitive element, has led to rapid development of large-area, two-dimensional sensing devices, such as X-ray detection panels and fingerprint identification panels, which are widely used in medical examination, material crack detection and customs security checking and other fields. A main structure of such a two-dimensional sensing device includes a thin film transistor and a photodiode. When a light signal is applied to the photodiode, the amount of photo-generated electric charges generated will reflect the illumination information. The storage and reading of the illumination information is controlled by the turning off and on of the thin film transistor.

The photodiode includes P (positive)-type and N (negative)-type semiconductors with high doping concentrations, as well as an intrinsic (I)-type layer with a very low-doping concentration formed between the P- and N-type semiconductors. Due to a very small absorption coefficient of the I-type layer, incident light can enter the interior of the material very easily and be sufficiently absorbed to create a large number of electron-hole pairs. Accordingly, the photoelectric conversion efficiency is higher. Furthermore, the P- and N-type layers on two sides of the I-type layer are very thin, and a drift time of photo-generated carriers are thus very short, making response speed of the device higher. When light is applied to the photodiode and the applied photoelectron energy is greater than a bandgap Eg, electrons in the valence band will absorb photon energy and transfer to the conduction band, thus forming an electron-hole pair. For the electron-hole pairs in the intrinsic layer, electrons drift to the N region and holes drift to the P region under the action of a strong electric field, thus forming photocurrent. When the light irradiation power changes, the current changes accordingly and linearly, thereby achieving the conversion of the optical signal into an electrical signal.

In the related art, the photodiodes are usually fabricated by adopting a plasma enhanced chemical vapor deposition (PECVD) process. In the PECVD process, a strong electric or magnetic field is used to ionize the original molecules of the required gas so as to create plasma which contains plenty of highly reactive chemical groups, and after these chemical groups undergo a series of chemical and plasma reactions, a solid thin film is formed on a sample surface.

SUMMARY

One embodiment of the present disclosure provides a method for manufacturing a display panel, which includes steps of:

forming, on a substrate, a thin film transistor that includes a gate electrode, an active layer, a source electrode and a drain electrode;

forming a hydrogen diffusion barrier layer that covers the entire substrate, wherein the hydrogen diffusion barrier layer is electrically conductive and is electrically connected to the drain electrode; and forming a photosensitive structure layer on the hydrogen diffusion barrier layer.

In one example, the step of forming the photosensitive structure layer on the hydrogen diffusion barrier layer may include:

depositing an N-type amorphous silicon thin film on the hydrogen diffusion barrier layer by adopting a plasma enhanced chemical vapor deposition process;

depositing an intrinsic amorphous silicon thin film on the N-type amorphous silicon thin film; and subjecting the intrinsic amorphous silicon thin film to ion implantation, and subjecting the ion-implanted intrinsic amorphous silicon thin film to activation treatment to form a P-type amorphous silicon thin film on an upper layer of the intrinsic amorphous silicon thin film.

In one example, the method may further include:

depositing a first conductive thin film on the photosensitive structure layer; and patterning the hydrogen diffusion barrier layer, the photosensitive structure layer and the first conductive thin film to form a photodiode consisting of a barrier electrode formed by the hydrogen diffusion barrier layer, a photosensitive structure formed by the photosensitive structure layer and a first electrode formed by the first conductive thin film.

In one example, the method may further include:

forming a planarization layer after the patterning, wherein the planarization layer has a via hole that runs through the planarization layer to expose the first electrode; and forming, on the planarization layer, a second electrode that is electrically connected to the first electrode through the via hole.

In one example, the method may further include forming a light-shielding layer on the planarization layer, wherein an orthogonal projection of the light-shielding layer on the substrate covers an orthogonal projection of a channel area on the substrate.

In one example, the light-shielding layer and the second electrode may be formed simultaneously.

In one example, the method may further include forming, on the second electrode, an electrode lead that is electrically connected to the second electrode.

In one example, the hydrogen diffusion barrier layer may include a first material layer, a second material layer and a third material layer stacked one on another, wherein the first material layer and the third material layer may include indium tin oxide, and the second material layer may include silver.

In one example, the active layer may include indium gallium zinc oxide or indium tin zinc oxide.

In one example, the step of forming the thin film transistor on the substrate may include:

forming, on the substrate, the gate electrode and a signal line, and a first insulating layer covering the gate electrode and the signal line;

forming the active layer on the first insulating layer, wherein the active layer is an oxide active layer;

forming a second insulating layer covering the oxide active layer, wherein the second insulating layer has two first via holes that run through the second insulating layer to expose the oxide active layer, and a second via hole that runs through the first insulating layer and the second insulating layer to expose the signal line;

forming the source electrode, the drain electrode and a connecting electrode on the second insulating layer, wherein the source electrode and the drain electrode are electrically connected to the oxide active layer through the two first via holes, respectively, and the connecting electrode is electrically connected to the signal line through the second via hole; and forming a third insulating layer covering the source electrode, the drain electrode and the connecting electrode, wherein the third insulating layer has a third via hole that runs through the third insulating layer to expose the drain electrode, and a fourth via hole that runs through the third insulating layer to expose the connecting electrode.

In one example, the step of forming the thin film transistor on the substrate may include:

forming, on the substrate, the gate electrode and a first insulating layer covering the gate electrode;

forming the active layer on the first insulating layer, wherein the active layer is an oxide active layer;

forming the source electrode and the drain electrode on the oxide active layer; and forming a third insulating layer covering the source electrode and the drain electrode, wherein the third insulating layer has a third via hole that runs through the third insulating layer to expose the drain electrode.

In one embodiment of the present disclosure, there is provided a display panel that is manufactured using the method as described above.

In one embodiment of the present disclosure, the display panel is used for fingerprint identification or X-ray detection.

In one embodiment of the present disclosure, there is provided a display device that includes the display panel as described above.

BRIEF DESCRIPTION OF THE DRAWINGS

The accompanying drawings are provided for further understanding of the technical solutions of the present disclosure, constitute a part of this specification, and are used together with the embodiments of the present disclosure to explain the technical solutions of the present disclosure, but do not constitute limitations thereof. Shapes and sizes of components in the drawings do not reflect their true scales and are merely for illustrating the present disclosure.

DETAILED DESCRIPTION

Specific embodiments of the present disclosure will be further described hereinafter in detail in conjunction with the drawings and examples. The following examples are merely for illustrating the present disclosure, and are not intended to limit the scope thereof. It should be noted that examples of the present disclosure and features therein can be combined in any manner without confliction.

In recent years, with the rapid development of display technology, the technology of thin film transistors have evolved from the foregone amorphous silicon (a-Si) thin film transistors to low-temperature polysilicon (LTPS) thin film transistors, oxide thin film transistors, etc. When an oxide such as indium gallium zinc oxide (IGZO) or indium tin zinc oxide (ITZO) is used as an active layer, its carrier mobility is about 20 to 30 times of that of the amorphous silicon, and it is characterized in high mobility, high on-state current, better switching characteristics and better uniformity, and thus can significantly improve a charge/discharge rate of the thin film transistor to the pixel electrode, increase a response speed of the pixel and realize a faster refresh rate. It is thus applicable to applications that require fast response and large current, such as displays with high-frequency, high-resolution and large-size, and organic light-emitting displays.

The inventors of the present application have found that there is a problem that the channel of the thin film transistor is damaged in the process of fabricating the photodiode in the related art, and the reason is that during the fabrication of the photodiode by the PECVD process, the gas used usually contains silane $SiH_4$ and $NH_3$, thus a large number of hydrogen atoms and hydrogen ions are generated during the deposition, the generated hydrogen ions diffuse into the oxide active layer in the channel area of the thin film transistor, and destroy the undoped nature of the oxide active layer in the channel area to some extent. As a result, the carrier mobility of the oxide active layer in the channel area is decreased, the characteristics of the active layer are adversely affected, and the operation performance of the thin film transistor is degraded.

In the preparation of an X-ray detection panel or a fingerprint identification panel, when the PECVD process is adopted to fabricate the photodiode, there is a problem of damaging the channel of the thin film transistor, which adversely affects the characteristics of the oxide active layer and degrades the operation performance of the thin film transistor.

In order to overcome the problem that the channel of the thin film transistor will be damaged during the PECVD process, embodiments of the present disclosure provide a display panel, its manufacturing method, and a display device comprising the display panel.

Figure 1:
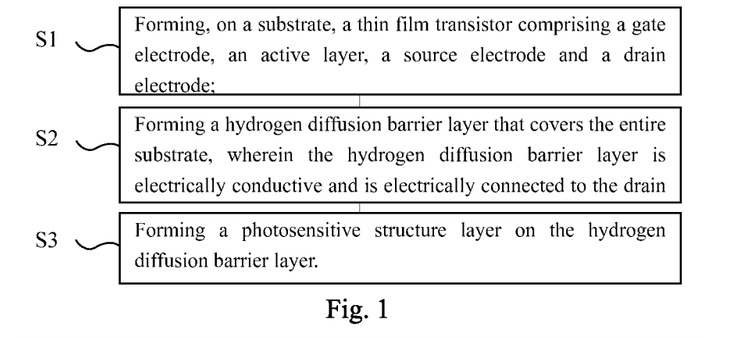
FIG. 1 is a flowchart showing a method for manufacturing a display panel according to an embodiment of the present disclosure.

FIG. 1 is a flowchart showing a method for manufacturing a display panel according to an embodiment of the present disclosure. As shown in FIG. 1, the method includes the following steps:

S1: forming, on a substrate, a thin film transistor that includes a gate electrode, an active layer, a source electrode and a drain electrode;

S2: forming a hydrogen diffusion barrier layer that covers the entire substrate, wherein the hydrogen diffusion barrier layer is electrically conductive and is electrically connected to the drain electrode; and S3: forming a photosensitive structure layer on the hydrogen diffusion barrier layer.

In the method for manufacturing the display panel of this embodiment of the present disclosure, the hydrogen diffusion barrier layer that covers the entire substrate is formed prior to the fabrication of the photodiode. The previously formed hydrogen diffusion barrier layer can effectively protect the channel of the thin film transistor during the subsequent process of fabricating the photodiode, thereby to prevent the hydrogen ions generated during the PECVD process from diffusing into the oxide active layer in the channel area of the thin film transistor. As compared with the process in the related art, the method for manufacturing the display panel in this embodiment of the present disclosure not only achieves the effects of overcoming the problem that the channel of the thin film transistor will be damaged by the PECVD process and ensuring the characteristics of the oxide active layer and the operation performance of the thin film transistor, but also causes a very small change in the process of the related art, and thus has an extensive application prospect.

In one example of the method for manufacturing the display panel of the present disclosure, the step S1 may include:

forming, on the substrate, the gate electrode and a signal line and a first insulating layer covering the gate electrode and the signal line;

forming an oxide active layer on the first insulating layer;

forming a second insulating layer covering the oxide active layer, wherein the second insulating layer has two first via holes that run through the second insulating layer to expose the oxide active layer and a second via hole that runs through the first insulating layer and the second insulating layer to expose the signal line;

forming the source electrode, the drain electrode and a connecting electrode on the second insulating layer, wherein the source electrode and the drain electrode are electrically connected to the oxide active layer through the two first via holes, respectively, and the connecting electrode is electrically connected to the signal line through the second via hole; and forming a third insulating layer covering the source electrode, the drain electrode and the connecting electrode, wherein the third insulating layer has a third via hole that runs through the third insulating layer to expose the drain electrode and a fourth via hole that runs through the third insulating layer to expose the connecting electrode.

The gate electrode, the signal line, the first insulating layer, the oxide active layer, the second insulating layer, the source electrode, the drain electrode, the connecting electrode and the third insulating layer constitute an array structure layer.

The step S2 may include: forming a third metal thin film that serves as the hydrogen diffusion barrier layer and covers the entire substrate.

The step S3 may include:

depositing an N-type amorphous silicon thin film on the hydrogen diffusion barrier layer by adopting a plasma enhanced chemical vapor deposition (PECVD) process;

depositing an intrinsic amorphous silicon thin film on the N-type amorphous silicon thin film; and subjecting the intrinsic amorphous silicon thin film to ion implantation, and subjecting the ion-implanted intrinsic amorphous silicon thin film to activation treatment to form a P-type amorphous silicon thin film on an upper layer of the intrinsic amorphous silicon thin film.

The N-type amorphous silicon thin film, the intrinsic amorphous silicon thin film and the P-type amorphous silicon thin film constitute a photosensitive structure layer.

The method further includes:

depositing a first conductive thin film on the photosensitive structure layer;

patterning the hydrogen diffusion barrier layer, the photosensitive structure layer and the first conductive thin film to form a photodiode consisting of a barrier electrode formed by the hydrogen diffusion barrier layer, a photosensitive structure formed by the photosensitive structure layer and a first electrode formed by the first conductive thin film;

forming a planarization layer covering the previously formed patterns, wherein the planarization layer has a fifth via hole that runs through the planarization layer to expose the first electrode and a sixth via hole that runs through the first insulating layer, the second insulating layer, the third insulating layer and the planarization layer to expose the signal line;

forming a second electrode and a light-shielding layer on the planarization layer, wherein the second electrode is electrically connected to the first electrode through the fifth via hole, and is electrically connected to the connecting electrode through the sixth via hole, and an orthogonal projection of the light-shielding layer on the substrate covers an orthogonal projection of a channel area on the substrate; and forming a protection layer covering the previously formed patterns.

The step of forming the second electrode and the light-shielding layer on the planarization layer includes:

depositing a second conductive thin film on the planarization layer and performing patterning process so as to form a second electrode; and depositing a light-shielding thin film and performing patterning process so as to form the light-shielding layer; or depositing a light-shielding thin film on the planarization layer and performing patterning process so as to form a light-shielding layer; and then depositing a second conductive thin film and performing patterning process so as to form a second electrode; or depositing a second conductive thin film and a light-shielding thin film on the planarization layer one on another, and performing patterning process with a half-tone or grey-tone mask to form the second electrode and the light shielding layer.

In another example of the method for manufacturing the display panel of the present disclosure, the step S1 may include:

forming, on the substrate, the gate electrode and a first insulating layer that covers the gate electrode;

forming an oxide active layer on the first insulating layer;

forming the source electrode and the drain electrode on the oxide active layer; and forming a third insulating layer that covers the source electrode and the drain electrode, wherein the third insulating layer has a third via hole that runs through the third insulating layer to expose the drain electrode.

The gate electrode, the first insulating layer, the oxide active layer, the source electrode, the drain electrode and the third insulating layer constitute an array structure layer.

The step S2 may include: forming a third metal thin film that serves as a hydrogen diffusion barrier layer and covers the entire substrate.

The step S3 may include:

depositing an N-type amorphous silicon thin film on the hydrogen diffusion barrier layer by adopting a PECVD process;

depositing an intrinsic amorphous silicon thin film on the N-type amorphous silicon thin film; and subjecting the intrinsic amorphous silicon thin film to ion implantation, and subjecting the ion-implanted intrinsic amorphous silicon thin film to activation treatment to form a P-type amorphous silicon thin film on an upper layer of the intrinsic amorphous silicon thin film.

The N-type amorphous silicon thin film, the intrinsic amorphous silicon thin film and P-type amorphous silicon thin film constitute a photosensitive structure layer.

The method further comprises:

depositing a first conductive thin film on the photosensitive structure layer;

patterning the hydrogen diffusion barrier layer, the photosensitive structure layer and the first conductive thin film to form a photodiode consisting of a barrier electrode formed by the hydrogen diffusion barrier layer, a photosensitive structure formed by the photosensitive structure layer and a first electrode formed by the first conductive thin film;

forming a passivation layer and a planarization layer that cover the previously formed patterns and have a fifth via hole running through the passivation layer and the planarization layer to expose the first electrode;

forming a second electrode and an electrode lead on the planarization layer, wherein the electrode lead is electrically connected to the first electrode through the fifth via hole; and forming a protection layer that covers the previously formed patterns.

The technical solutions of the present disclosure will be further described hereinafter through specific embodiments of the method for manufacturing the display panel of the present disclosure. The term "patterning process" mentioned in the following embodiments includes depositing a film layer, coating a photoresist, exposing with a mask plate, developing, etching, peeling off the photoresist and other processes, and is a mature preparation process. The deposition may be carried out with a known process such as sputtering, evaporation, chemical vapor deposition, etc. Also, coating and etching may be carried out with respective known processes. Therefore, these processes will not be specifically defined herein.

First Embodiment

FIGS. 2 to 11 are schematic views showing a method for manufacturing a display panel according to a first embodiment of the present disclosure. The display panel manufactured in this embodiment can be used as a fingerprint identification panel.

Figure 2:
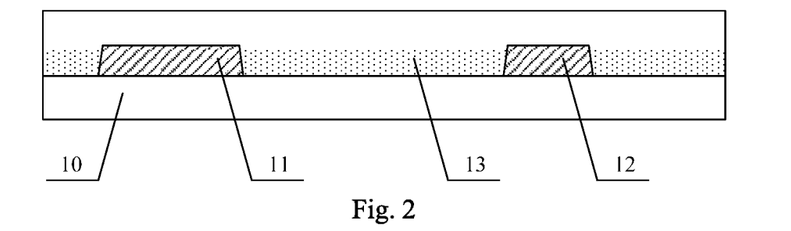
FIG. 2 is a schematic view of a structure after patterns of a gate electrode and a signal line have been formed by a method for manufacturing the display panel according to a first embodiment of the present disclosure.

In a first patterning process, patterns of a gate electrode and a signal line are formed on a substrate by patterning. The step of forming the patterns of the gate electrode and the signal line may include: depositing a first metal thin film on a substrate 10, coating a layer of photoresist on the first metal thin film, exposing and developing the photoresist with a single-tone mask plate so as to form unexposed areas with photoresist reserved in the positions of the patterns of the gate electrode and the signal line, and fully-exposed areas with photoresist removed in the other positions, and etching the first metal thin film in the fully-exposed areas and peeling off the remaining photoresist to form the patterns of the gate electrode 11 and the signal line 12. Thereafter, a first insulating layer 13 that covers the patterns of the gate electrode 11 and the signal line 12 is deposited, as shown in FIG. 2. In the first patterning process, gate lines (not shown) are also formed at the same time, and there is a one-to-one correspondence between the gate lines and the transistors in each row and the gate lines are electrically connected to the gate electrodes of the transistors in the corresponding row.

Figure 3:
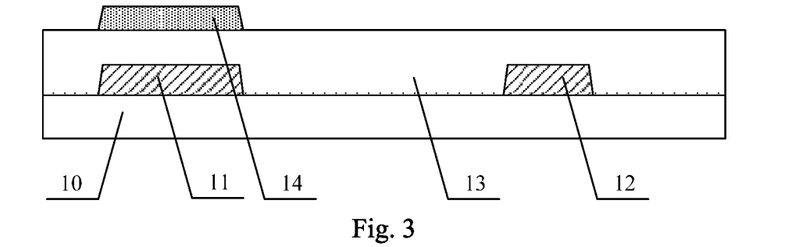
FIG. 3 is a schematic view of a structure after a pattern of an oxide active layer has been formed by the method for manufacturing the display panel according to the first embodiment of the present disclosure.

In a second patterning process, on the substrate formed with the aforementioned patterns, a pattern of an oxide active layer is formed by patterning. The step of forming the pattern of the oxide active layer may include: depositing an active layer film on the first insulating layer 13, first performing a conductor-forming process on the active layer film and then coating a layer of photoresist on the active layer film on which the conductor-forming process has been performed, exposing and developing the photoresist with a single-tone mask plate to form an unexposed area with photoresist reserved in the position of the pattern of the active layer and fully-exposed areas with photoresist removed in the other positions, and etching the active layer film in the fully-exposed areas and peeling off the remaining photoresist to form the pattern of the oxide active layer 14, as shown in FIG. 3.

Figure 4:
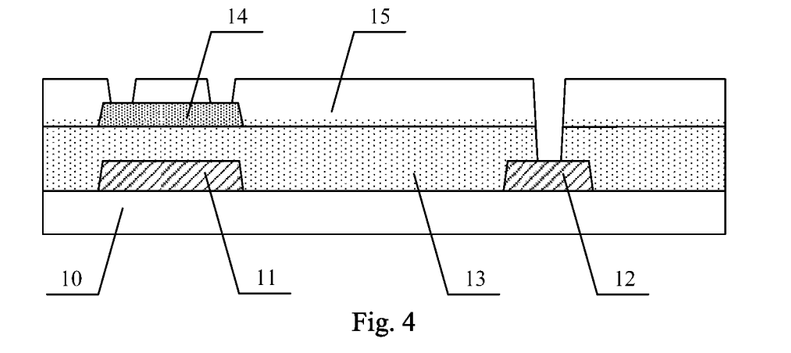
FIG. 4 is a schematic view of a structure after a pattern of a second insulating layer pattern has been formed by the method for manufacturing the display panel according to the first embodiment of the present disclosure.

In a third patterning process, on the substrate formed with the aforementioned patterns, a pattern of a second insulating layer with via holes is formed by patterning. The step of forming the pattern of the second insulating layer with the via holes may include: depositing a second insulating thin film on the substrate formed with the aforementioned patterns, coating a layer of photoresist on the second insulating thin film, exposing and developing the photoresist with a single-tone mask plate to form fully-exposed areas with photoresist removed in the positions of the via holes and unexposed areas with photoresist reserved in the other positions, and etching the second insulating thin film and the first insulating layer in the fully-exposed areas and peeling off the remaining photoresist to form the pattern of the second insulating layer 15 with the via holes, wherein the via holes include two first via holes in the position of the oxide active layer and one second via hole in the position of the signal line, in which the first via holes run through the second insulating layer 15 to expose a surface of the oxide active layer and the second via hole runs through the second insulating layer 15 and the first insulating layer 13 to expose a surface of the signal line, as shown in FIG. 4. In this embodiment, the second insulating thin film actually serves as an etching barrier layer to prevent the oxide active layer from being affected by a subsequent patterning process for preparing patterns of a source electrode and a drain electrode.

Figure 5:
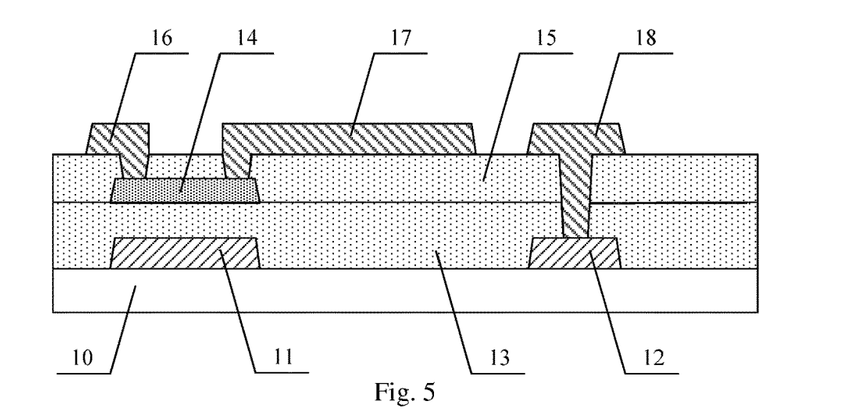
FIG. 5 is a schematic view of a structure after patterns of a drain electrode and a connecting electrode have been formed by the method for manufacturing the display panel according to the first embodiment of the present disclosure.

In a fourth patterning process, on the substrate formed with the aforementioned patterns, patterns of a source electrode, a drain electrode and a connecting electrode are formed by patterning. The steps of forming the patterns of the source electrode, the drain electrode and the connecting electrode may include: depositing a second metal thin film on the substrate formed with the aforementioned patterns, coating a layer of photoresist on the second metal thin film, exposing and developing the photoresist with a single-tone mask plate to form unexposed areas with photoresist reserved in the positions of the patterns of the source electrode, the drain electrode and the connecting electrode, and fully-exposed areas with photoresist removed in the other positions, and etching the second metal thin film in the fully-exposed areas and peeling off the remaining photoresist to form the patterns of the source electrode 16, the drain electrode 17 and the connecting electrode 18, as shown in FIG. 5. The source electrode 16 and the drain electrode 17 are electrically connected to the oxide active layer 14 through the two first via holes, respectively, a channel area is formed between the source electrode 16 and the drain electrode 17, and the connecting electrode 18 is electrically connected to the signal line 12 through the second via hole. In the fourth patterning process, data lines (not shown) are also formed at the same time, and there is a one-to-one correspondence between the data lines and the transistors in each column and the data lines are electrically connected to the source electrodes of the transistors in the corresponding column.

Figure 6:
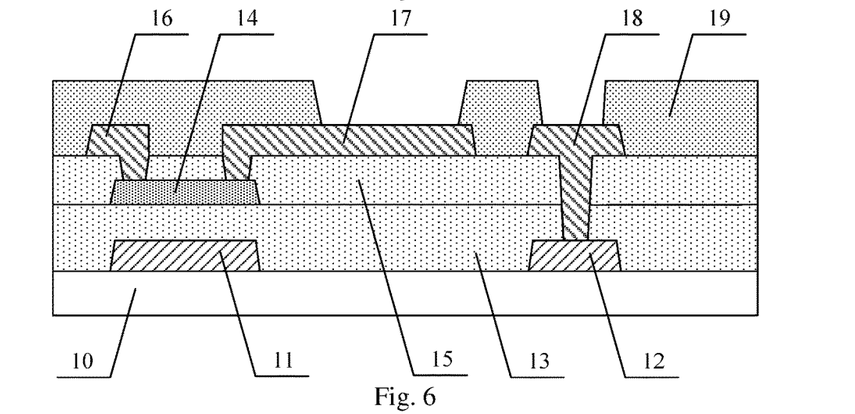
FIG. 6 is a schematic view of a structure after a pattern of a third insulation layer has been formed by the method for manufacturing the display panel according to the first embodiment of the present disclosure.

In a fifth patterning process, on the substrate formed with the aforementioned patterns, a pattern of the third insulating layer with via holes is formed by patterning. The step of forming the pattern of the third insulating layer with the via holes may include: depositing a third insulating thin film on the substrate formed with the aforementioned patterns, coating a layer of photoresist on the third insulating thin film, exposing and developing the photoresist with a single-tone mask plate to form fully-exposed areas with the photoresist removed in the positions of the via holes and unexposed areas with photoresist reserved in the other positions, and etching the third insulating thin film in the fully-exposed areas and peeling off the remaining photoresist to form the pattern of the third insulating layer 19 with the via holes, wherein the via holes include a third via hole in the positions of the drain electrode 17 and a fourth via hole in the positions of the connecting electrode 18, wherein the third via hole runs through the third insulating layer 19 to expose a surface of the drain electrode 17 and the fourth via hole runs through the third insulating layer 19 to expose a surface of the connecting electrode 18, as shown in FIG. 6.

Figure 7:
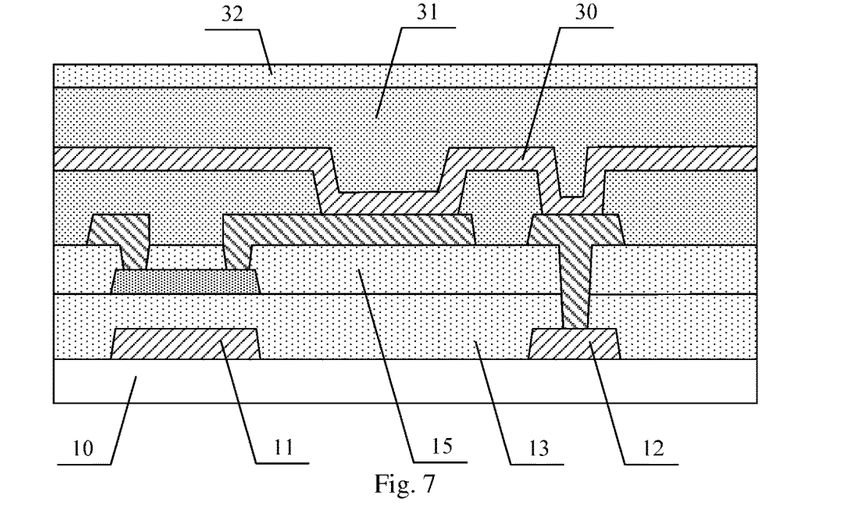
FIG. 7 is a schematic view of a structure after a hydrogen diffusion barrier layer and other film layers have been formed by the method for manufacturing the display panel according to the first embodiment of the present disclosure.
Figure 8:
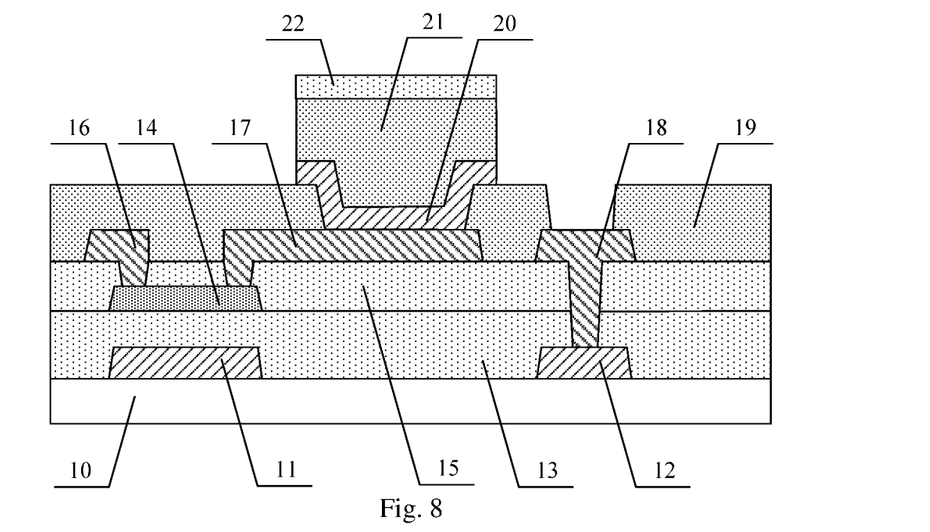
FIG. 8 is a schematic view of a structure after a pattern of a photodiode has been formed by the method for manufacturing the display panel according to the first embodiment of the present disclosure.

In a sixth patterning process, on the substrate formed with the aforementioned patterns, a structure film layer comprising a photodiode is formed by patterning. The step of forming the structure film layer comprising the photodiode may include: first depositing, on the substrate formed with the aforementioned patterns, a third metal thin film 30 that serves as the hydrogen diffusion barrier layer and covers the entire substrate 10, then depositing an N-type amorphous silicon thin film on the third metal thin film 30 by adopting a PECVD process, depositing an intrinsic amorphous silicon thin film on the N-type amorphous silicon thin film, subjecting the intrinsic amorphous silicon thin film to ion implantation and subjecting the ion-implanted intrinsic amorphous silicon thin film to activation treatment to form a P-type amorphous silicon thin film on an upper layer of the intrinsic amorphous silicon thin film, so as to form a photosensitive structure layer 31, and finally depositing a first conductive thin film 32 on the P-type amorphous silicon thin film, as shown in FIG. 7. After finishing the deposition of the film layers, a layer of photoresist is coated on the first conductive thin film, the photoresist is exposed and developed with a single-tone mask plate to form an un-exposed area with photoresist reserved in the position of the pattern of the photodiode and fully-exposed areas with photoresist removed in the other positions. Thereafter, the third conductive thin film 30, the photosensitive structure layer 31 and the first metal thin film 32 in the fully-exposed areas are etched and the remaining photoresist is peeled off to form patterns of a barrier electrode 20, a photosensitive structure 21 and a first electrode 22. The barrier electrode 20, the photosensitive structure 21 and the first electrode 22 constitute a photodiode, in which the barrier electrode 20 is electrically connected to the drain electrode 17 through the third via hole, the N-type amorphous silicon layer of the photosensitive structure 21 is electrically connected to the barrier electrode 20, and the P-type amorphous silicon layer is electrically connected to the first electrode 22, as shown in FIG. 8. The manner in which the ion implantation is carried out may be ion shower doping or ion implantation doping, and the activation treatment may be annealing using an annealing oven, or rapid thermal anneal (RTA).

Figure 9:
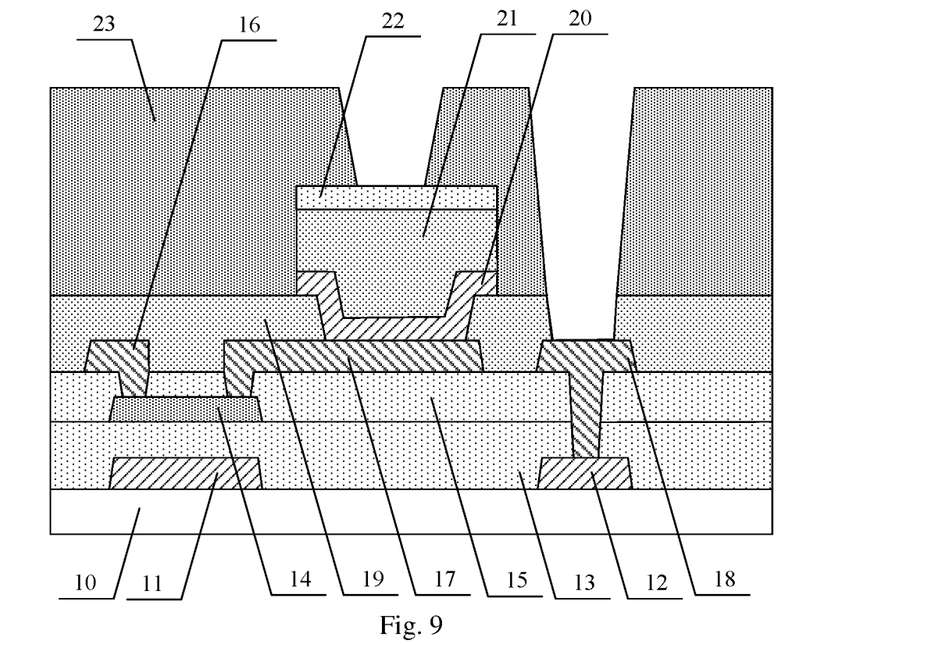
FIG. 9 is a schematic view of a structure after a pattern of a planarization layer has been formed by the method for manufacturing the display panel according to the first embodiment of the present disclosure.

In a seventh patterning process, on the substrate formed with the aforementioned patterns, a pattern of a planarization layer (PLN) with via holes is formed by patterning. The step of forming the pattern of the planarization layer with the via holes may include: coating a resin thin film on the substrate formed with the aforementioned patterns, exposing and developing the resin thin film with a single-tone mask plate to form fully-exposed areas with the resin thin film removed in the positions of the first electrode and the connecting electrode, and unexposed areas with the resin thin film reserved in the other positions, so as to form the pattern of the planarization layer 23 with the via holes, wherein the via holes include a fifth via hole in the positions of the first electrode 22 and a sixth via hole in the positions of the connecting electrode 18, wherein the fifth via hole runs through the planarization layer 23 to expose a surface of the first electrode 22 and the sixth via hole runs through the planarization layer 23 and the third insulating layer 19 to expose a surface of the connecting electrode 18, as shown in FIG. 9.

Figure 10:
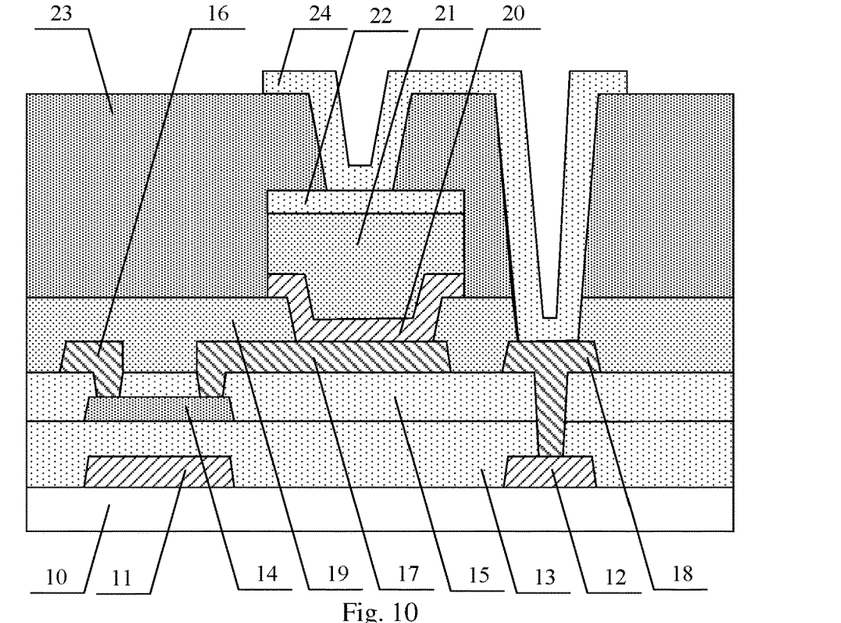
FIG. 10 is a schematic view of a structure after a pattern of a second electrode has been formed by the method for manufacturing the display panel according to the first embodiment of the present disclosure.

In an eighth patterning process, on the substrate formed with the aforementioned patterns, a pattern of a second electrode is formed by patterning. The step of forming the pattern of the second electrode may include: depositing a second conductive thin film on the substrate formed with the aforementioned patterns, coating a layer of photoresist on the second conductive thin film, exposing and developing the photoresist with a single-tone mask plate to form an unexposed area with the photoresist reserved in a position of the second electrode and fully-exposed areas with the photoresist removed in the other positions, and etching the second conductive thin film in the fully-exposed areas and peeling off the remaining photoresist to form a pattern of the second electrode 24 that is electrically connected to the first electrode 22 through the fifth via hole and is electrically connected to the connecting electrode 18 through the sixth via hole, as shown in FIG. 10.

Figure 11:
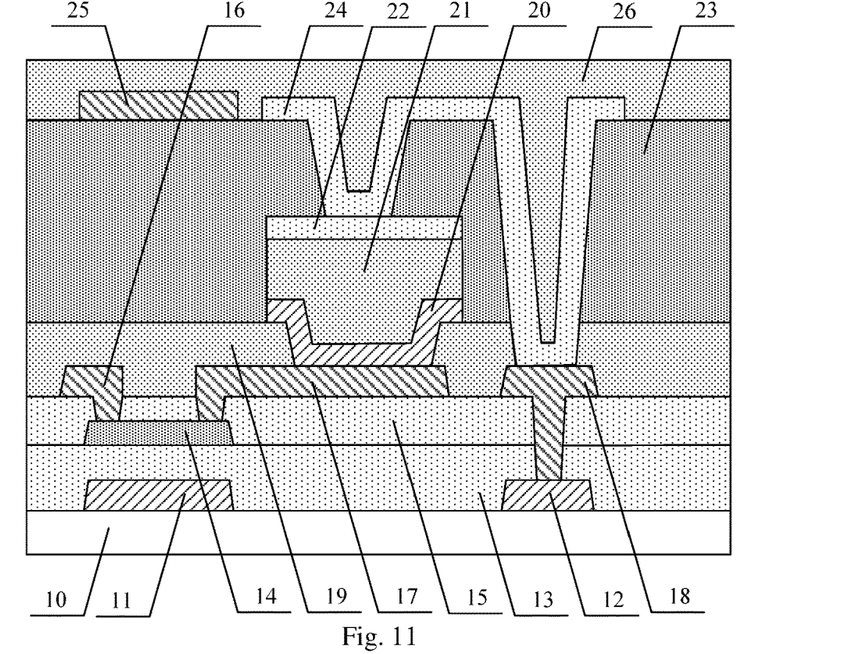
FIG. 11 is a schematic view of a structure after a pattern of a light-shielding layer has been formed by the method for manufacturing the display panel according to the first embodiment of the present disclosure.

In a ninth patterning process, on the substrate formed with the aforementioned patterns, a pattern of a light-shielding layer is formed by patterning. The step of forming the pattern of the light-shielding layer may include: depositing a light-shielding thin film on the substrate formed with the aforementioned patterns, coating a layer of photoresist on the light-shielding thin film, exposing and developing the photoresist with a single-tone mask plate to form an unexposed area with the photoresist reserved in the position of the pattern of the light-shielding layer and fully-exposed areas with the photoresist removed in the other positions, and etching the light-shielding thin film in the fully-exposed areas and peeling off the remaining photoresist to form a pattern of the light-shielding layer 25. The pattern of the light-shielding layer 25 is located above the channel area, and an orthogonal projection of the light-shielding layer 25 on the substrate covers an orthogonal projection of the channel area on the substrate. Finally, on the substrate formed with the aforementioned patterns, a protection layer 26 is coated, as shown in FIG. 11. The protection layer 26 is used to increase an adhesion of subsequent film layers and reduce leakage current.

In this embodiment, the substrate may comprise a glass substrate or a quartz substrate. The first metal thin film and the second metal thin film may comprise one or more metals selected from the group consisting of metals such as Pt, Ru, Au, Ag, Mo, Cr, Al, Ta, Ti, and W. The third metal thin film serving as the hydrogen diffusion barrier layer may comprise a metal such as Mo or Ag, and preferably a composite layer of indium tin oxide (ITO)/Ag/ITO. In other words, the hydrogen diffusion barrier layer may comprise a first material layer, a second material layer and a third material layer stacked one on another wherein the first material layer and the third material layer include ITO, and the second material layer includes silver. The light-shielding thin film may comprise metal. The first insulating layer, the second insulating layer and the third insulating layer may be a gate insulating layer, and may comprise $SiN_x$, $SiO_x$ or a composite thin film of $SiN_x/SiO_x$. The protection layer may comprise resin material. The oxide active layer may comprise IGZO or ITZO. The first conductive thin film and the second conductive thin film may comprise ITO or IZO (indium zinc oxide).

As can be seen from the manufacturing process of the display panel as shown in FIGS. 2 to 11, the hydrogen diffusion barrier layer that covers the entire substrate is provided prior to the fabrication of the photodiode in this embodiment so that in the subsequent process of fabricating the photodiode by adopting the PECVD process, hydrogen ions generated by the PECVD process can be effectively blocked by the hydrogen diffusion barrier layer, and cannot diffuse into the channel area of the thin film transistor. Therefore, the method for manufacturing the display panel of the present disclosure not only achieves the effects of overcoming the problem that the channel of the thin film transistor will be damaged by the PECVD process and ensuring the characteristics of the oxide active layer and the operation performance of the thin film transistor, but also causes a very small change in the process of the related art. Furthermore, in the related art, the light-shielding layer is usually disposed between the third insulating layer (or the passivation layer) and the planarization layer, and the light-shielding effect thereof is not ideal. By contrast, the light-shielding layer in this embodiment is disposed on the planarization layer, with a large distance between the light-shielding layer and the channel of the thin film transistor, so that the light-shielding area is large and the light-shielding effect is maximally improved. Further, in the structure in the related art, the photodiode is usually electrically connected to the drain electrode through the third via hole, and since the etching of the third via hole may cause damage to the surface of the drain electrode, there is a problem of poor contact of the photodiode with the drain electrode. By contract, the photodiode in this embodiment is electrically connected to the drain electrode through the barrier electrode, and since the barrier electrode comprises the composite layer of ITO/Ag/ITO, the problem of poor contact of the photodiode with the drain electrode is effectively overcome.

It should be noted that the process of manufacturing the display panel has been described by taking nine patterning processes as an example in this embodiment, but in actual implementation, the above-mentioned preparation sequence, preparation processes and number of the patterning processes may be adjusted according to actual needs, and they are not specifically defined here. For example, the pattern of the light-shielding layer may be formed in the eighth patterning process, and then the pattern of the second electrode may be formed in the ninth patterning process. Furthermore, for example, another process may be used for forming the photosensitive structure layer. In addition, for example, the third patterning process for forming the pattern of the second insulating layer with the via holes may not be adopted, and the source electrode and the drain electrode are directly prepared on the oxide active layer. Additionally, the pattern of the light-shielding layer may be disposed in the same layer and formed at the same time as the barrier electrode. Furthermore, the structure of the first thin film transistor is described by taking a bottom gate structure as an example in this embodiment, but in actual implementation, the first thin film transistor may be a top gate structure, which will not be specifically defined herein.

The display panel manufactured by the method of this embodiment includes:

the substrate 10;

the gate line, the gate electrode 11 and the signal line 12 disposed on the substrate 10;

the first insulating layer 13 that covers the gate line, the gate electrode 11 and the signal line 12;

the oxide active layer 14 disposed on the first insulating layer 13;

the second insulating layer 15 that covers the oxide active layer 14, wherein the second insulating layer 15 is provided with two first via holes in the position of the surface of the oxide active layer 14, and one second via hole in the position of the signal line 12;

the data line, the source electrode 16, the drain electrode 17 and the connecting electrode 18 disposed on the second insulating layer 15, wherein the source electrode 16 and the drain electrode 17 are electrically connected to the oxide active layer 14 through the first via holes, respectively, with a channel area formed between the source electrode 16 and the drain electrode 17, and the connecting electrode 18 is electrically connected to the signal line 12 through the second via hole;

the third insulating layer 19 covering the source electrode 16, the drain electrode 17 and the connecting electrode 18, wherein the third insulating layer 19 is provided with the third via hole in the position of the drain electrode 17 and a fourth via hole in the position of the connecting electrode 18;

the barrier electrode 20, the photosensitive structure 21 and the first electrode 22 disposed on the third insulating layer 19, wherein the barrier electrode 20 is electrically connected to the drain electrode 17 through the third via hole, the N-type amorphous silicon layer of the photosensitive structure 21 is electrically connected to the barrier electrode 20, and the P-type amorphous silicon layer is electrically connected to the first electrode 22;

the planarization layer 23 covering the aforementioned patterns, wherein the planarization layer 23 is provided with the fifth via hole in the position of the first electrode 22 and a sixth via hole in the position of the connecting electrode 18;

the second electrode 24 and the light-shielding layer 25 disposed on the planarization layer 23, wherein the second electrode 24 is electrically connected to the first electrode 22 through the fifth via hole and is electrically connected to the connecting electrode 18 through the sixth via hole, and an orthogonal projection of the light-shielding layer 25 on the substrate covers an orthogonal projection of the channel area on the substrate; and the protection layer 26 covering the aforementioned patterns.

The display panel manufactured by the method of this embodiment may be used as a fingerprint identification panel, in which the thin film transistor serves as a switch unit, and the photodiode serves as a photosensitive unit that is electrically connected to the switch unit, the gate line may be a scan line, and the data line may be a fingerprint identifying and reading line. When the fingerprint identification panel is operating, a fixed voltage is applied to the signal line. When the gate line (the scan line) controls the thin film transistor to be turned on, a voltage is applied to the drain electrode of the thin film transistor through the data line (the fingerprint identifying and reading line), so as to cause the photosensitive unit to be in a reverse biased state. Next time the gate line controls the thin film transistor to be turned on, a signal on the data line is detected, and when a finger touch occurs, different portions of the fingerprint may cause differences in intensities of the light received by the photosensitive units in corresponding areas, resulting in variation of the voltage differences across the photosensitive units. Therefore, the fingerprint touch control can be realized by detecting the signals on the date lines.

Second Embodiment

This embodiment is an expansion based on the first embodiment, and differs from the first embodiment in that patterns of the second electrode and the light-shielding layer are simultaneously formed through the patterning process by adopting a half-tone or a grey-tone mask technology.

The first to seventh patterning processes in this embodiment are the same with those in the first embodiment, as shown in FIGS. 2 to 9.

Figure 12:
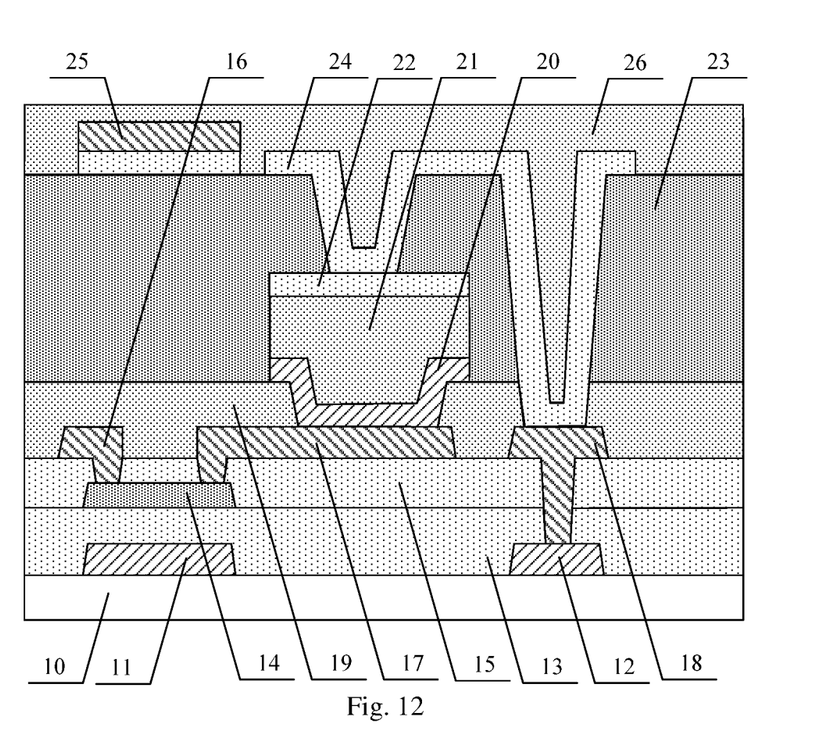
FIG. 12 is a structural schematic view of a display panel manufactured by a method for manufacturing a display panel according to a second embodiment of the present disclosure.

In an eighth patterning process, on the substrate formed with the aforementioned patterns, patterns of the second electrode and the light-shielding layer are formed simultaneously by patterning. The step of forming the patterns of the second electrode and the light-shielding layer may include: forming, on the substrate formed with the aforementioned patterns, a second conductive thin film and a light-shielding thin film one on another, coating a layer of photoresist on the light-shielding thin film, performing step exposure and development on the photoresist with a half-tone or a grey-tone mask plate to form an unexposed area with the photoresist having a first thickness in the position of the pattern of the light-shielding layer, a partially-exposed area with the photoresist having a second thickness that is less than the first thickness, in the position of the pattern of the second electrode, and fully-exposed areas with no photoresist in the other positions. The second conductive film and the light-shielding film in the fully-exposed areas are etched by a first etching process, and the photoresist overall is removed by the second thickness through ashing treatment to expose the light-shielding thin film in the partially-exposed area. Then, the light-shielding thin film in the partially-exposed area is etched by a second etching process and the remaining photoresist is peeled off to form the patterns of the second electrode 24 and the light-shielding layer 25. The second electrode 24 is electrically connected to the first electrode 22 through the fifth via hole, and to the connecting electrode 18 through the sixth via hole, and the second conducive thin film under the light-shielding layer 25 is retained, as shown in FIG. 12.

The materials of the film layers and the process requirements of this embodiment are the same as those of the first embodiment, and this embodiment also achieves the same technical effect of avoiding damage to the channel of the thin film transistor by the PECVD process as the first embodiment. Furthermore, the half-tone or grey-tone mask technology is used in this embodiment, which reduces one patterning process. Therefore, this embodiment has the advantages of simple processes and low manufacturing cost.

Third Embodiment

FIGS. 13 to 17 are schematic views showing a method for manufacturing a display panel according to a third embodiment of the present disclosure, and the display panel manufactured thereby can be used as an X-ray detection panel.

Figure 13:
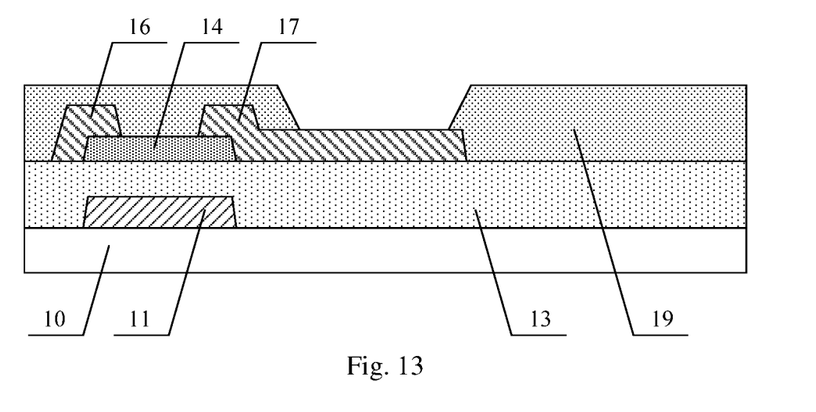
FIG. 13 is a schematic view of a structure after an array structure layer has been formed by a method for manufacturing a display panel according to a third embodiment of the present disclosure.

In a first patterning process, patterns of a gate line (not shown) and a gate electrode 11 are formed on a substrate by patterning, which is followed by depositing a first insulating layer 13 that covers the patterns of the gate line and the gate electrode 11. In a second patterning process, a pattern of an oxide active layer 14 is formed by patterning. In a third patterning process, on the substrate formed with the aforementioned patterns, patterns of a data line (not shown), a source electrode 16 and a drain electrode 17 are formed by patterning. In a fourth patterning process, a pattern of a third insulating layer 19 with via holes is formed by patterning, wherein the via holes include a third via hole in the position of the drain electrode 17 in which the third via hole runs through the third insulating layer 19 to expose a surface of the drain electrode 17, as shown in FIG. 13.

Figure 14:
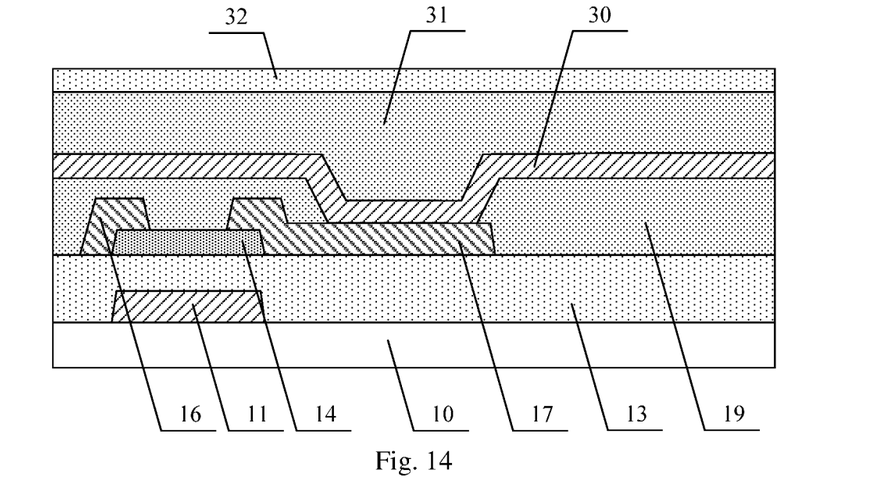
FIG. 14 is a schematic view of a structure after a hydrogen diffusion barrier layer and other film layers have been formed by the method for manufacturing the display panel according to the third embodiment of the present disclosure.
Figure 15:
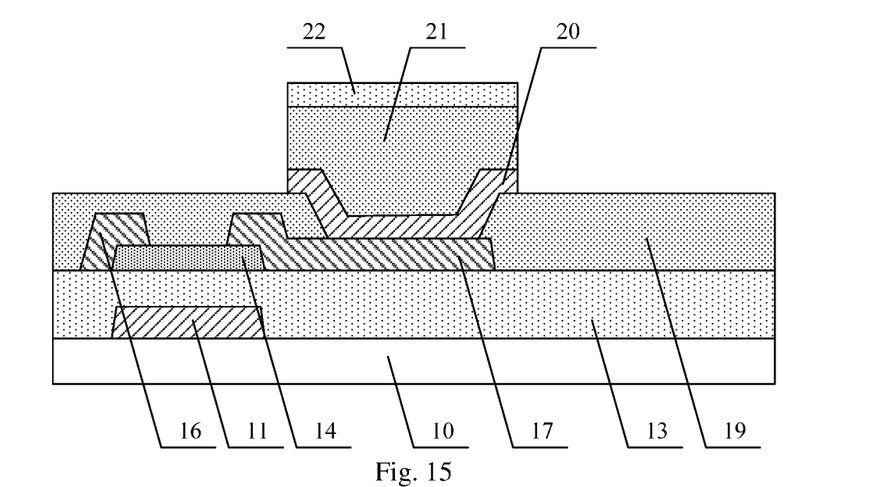
FIG. 15 is a schematic view of a structure after a pattern of a photodiode has been formed by the method for manufacturing the display panel according to the third embodiment of the present disclosure.

In a fifth patterning process, on the substrate formed with the aforementioned patterns, a structure film layer comprising a photodiode is formed by patterning. The step of forming the structure film layer comprising the photodiode may include: first depositing a third metal thin film 30 that serves as a hydrogen diffusion barrier layer and covers the entire substrate 10, and then depositing an N-type amorphous silicon thin film on the third metal thin film 30 by adopting a PECVD process, depositing an intrinsic amorphous silicon thin film on the N-type amorphous silicon thin film, subjecting the intrinsic amorphous silicon thin film to ion implantation and subjecting the ion-implanted intrinsic amorphous silicon thin film to activation treatment to form a P-type amorphous silicon thin film on an upper layer of the intrinsic amorphous silicon thin film, so as to form a photosensitive structure layer 31, and finally depositing a first conductive thin film 32 on the P-type amorphous silicon thin film, as shown in FIG. 14. After finishing the deposition of the film layers, a layer of photoresist is coated on the first conductive thin film 32, and the photoresist is exposed and developed with a single-tone mask plate to form an unexposed area with photoresist reserved in the position of the pattern of the photodiode and fully-exposed areas with photoresist removed in the other positions. Thereafter, the third conductive thin film 30, the photosensitive structure layer 31 and the first metal thin film 32 in the fully-exposed areas are etched and the remaining photoresist is peeled off to form patterns of a barrier electrode 20, a photosensitive structure 21 and a first electrode 22. The barrier electrode 20, the photosensitive structure 21 and the first electrode 22 constitute the photodiode, in which the barrier electrode 20 is electrically connected to the drain electrode 17 through the third via hole, the N-type amorphous silicon layer of the photosensitive structure 21 is electrically connected to the barrier electrode 20, and the P-type amorphous silicon layer is electrically connected to the first electrode 22, as shown in FIG. 15.

Figure 16:
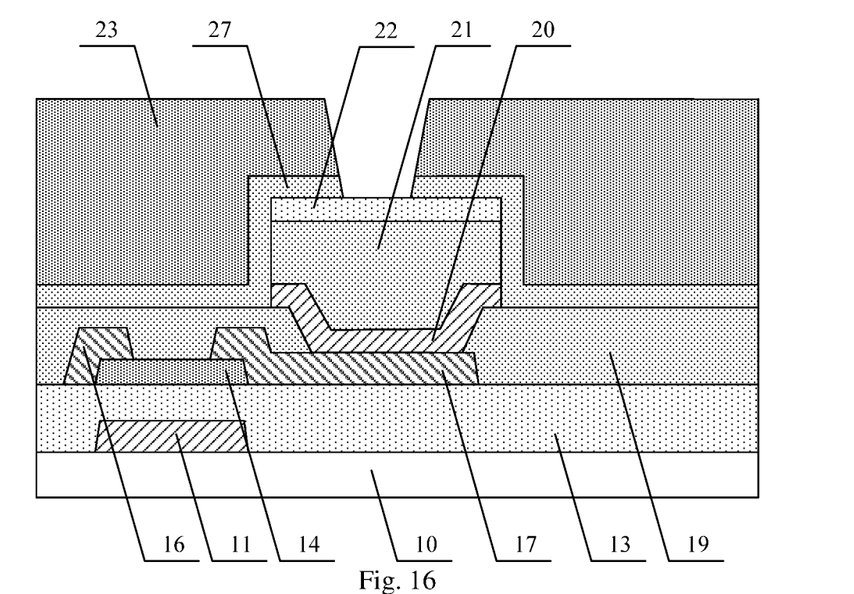
FIG. 16 is a schematic view of a structure after patterns of a passivation layer and a planarization layer have been formed by the method for manufacturing the display panel according to the third embodiment of the present disclosure.

In a sixth patterning process, on the substrate formed with the aforementioned patterns, patterns of a passivation layer and a planarization layer with via holes are formed by patterning. The step of forming the patterns of the passivation layer and the planarization layer with the via holes may include: first depositing a passivation thin film on the substrate formed with the aforementioned patterns, then coating a resin thin film, exposing and developing the resin thin film with a single-tone mask plate to form a fully-exposed area with the resin thin film removed in a position corresponding to the first electrode and unexposed areas with the resin thin film reserved in the other positions, and etching the passivation thin film in the fully-exposed area and peeling off the remaining resin thin film to form the patterns of the passivation layer 27 and the planarization layer 23 with the via holes, wherein the via holes include a fifth via hole in the position of the first electrode 22 that runs through the planarization layer 23 and the passivation layer 27 to expose a surface of the first electrode 22, as shown in FIG. 16.

Figure 17:
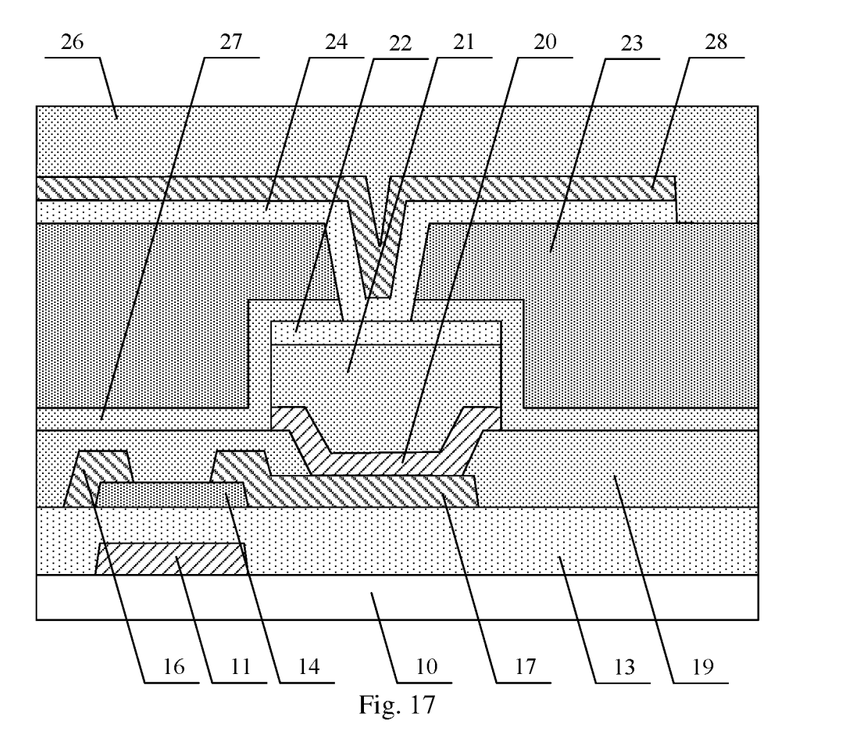
FIG. 17 is a schematic view of a structure after patterns of a second electrode and an electrode lead have been formed by the method for manufacturing the display panel according to the third embodiment of the present disclosure.

In a seventh patterning process, on the substrate formed with the aforementioned patterns, patterns of a second electrode and an electrode lead are formed by patterning. The step of forming the patterns of the second electrode and the electrode lead may include: depositing a second conductive thin film and a fourth metal thin film one on another on the substrate formed with the aforementioned patterns, coating a layer of photoresist on the fourth metal thin film, exposing and developing the photoresist with a single-tone mask plate, followed by etching to form the patterns of the second electrode 24 and the electrode lead 28 wherein the electrode lead 28 is electrically connected to the second electrode 24. Finally, on the substrate formed with the aforementioned patters, a protection layer 26 is deposited, as shown in FIG. 17.

In this embodiment, the materials of the film layers and the preparation methods are the same as those in the aforementioned embodiments. As can be seen from the process of manufacturing the display panel as shown in FIGS. 13 to 17, the hydrogen diffusion barrier layer that covers the entire substrate is provided prior to the fabrication of the photodiode in this embodiment so that in the subsequent process of fabricating the photodiode by the PECVD process, hydrogen ions generated by the PECVD process can be effectively blocked by the hydrogen diffusion barrier layer, thus cannot diffuse into the channel area of the thin film transistor. This embodiment not only achieves the effects of overcoming the problem that the channel of the thin film transistor will be damaged by the PECVD process and ensuring the characteristics of the oxide active layer and the operation performance of the thin film transistor, but also causes a very small change in the process of the related art.

The display panel manufactured by the method of this embodiment includes:

the substrate 10;

the gate line and the gate electrode 11 disposed on the substrate 10;

the first insulating layer 13 that covers the gate line and the gate electrode 11;

the oxide active layer 14 disposed on the first insulating layer 13;

the data line, the source electrode 16 and the drain electrode 17 disposed on the oxide active layer 14, wherein the source electrode 16 is disposed opposite to the drain electrode 17 and a channel area is formed therebetween;

the third insulating layer 19 that covers the source electrode 16, the drain electrode 17 and the connecting electrode 18, wherein the third insulating layer 19 is provided with a third via hole in the position of the drain electrode 17;

the barrier electrode 20, the photosensitive structure 21 and the first electrode 22 disposed on the third insulating layer 19, wherein the barrier electrode 20 is electrically connected to the drain electrode 17 through the third via hole, the N-type amorphous silicon layer of the photosensitive structure 21 is electrically connected to the barrier electrode 20, and the P-type amorphous silicon layer is electrically connected to the first electrode 22;

the passivation layer 27 and the planarization layer 23 that covers the aforementioned patterns, wherein the passivation layer 27 and the planarization layer 23 are provided with a fifth via hole to expose a surface of the first electrode 22;

the second electrode 24 and the electrode lead 28 disposed on the planarization layer 23, wherein the electrode lead 28 is electrically connected to the second electrode 24; and the protection layer 26 that covers the aforementioned patterns.

The display panel prepared by the manufacturing method of this embodiment can be used as an X-ray detection panel. For example, a scintillator layer or a phosphor layer may be also formed on the protective layer. When the X-ray detection panel is working, the irradiated X-rays are converted into visible light by the scintillator layer or the phosphor layer. The visible light is then absorbed by the photodiode and converted into charge carriers that are then stored in a storage capacitor or in the capacitor of the photodiode itself to form image charges. The thin film transistors are sequentially turned on row by row by an external scanning control circuit, and the image charges are output to an external data processing circuit in a manner of simultaneously reading one row at a time. An amount of the image charges read by each thin film transistor corresponds to a dose of incident X-rays. After processing by the external data processing circuit, the amount of charge per pixel point can be determined, and then the X-ray dose at each pixel point can be determined.

Fourth Embodiment

Based on the inventive concept of the aforementioned embodiments, this embodiment further provides a display device that includes the display panel manufactured by the method in any of the above embodiments. When the display panel is a fingerprint identification panel, the display device may be a mobile phone, a tablet, a television, a display, a laptop, a digital photo frame, a navigator, and any other product or component that has a display function. When the display panel is an X-ray detection panel, the display device may be an X-ray imaging system which is applied in a medical examination. The signal detected by the X-ray detection panel may be transmitted to a control device such as a computer. The control device then converts the signal into an image signal and controls the display device to display a corresponding image so that the distribution of X-rays can be visually seen.

Some features and advantages of the present disclosure have been described above in detail. Of course, the implementation of any of the products or methods of the present disclosure does not necessarily need to achieve all the advantages as described above at the same time.

It should be understood that in the description of the embodiments of the present disclosure, orientations or positional relationships indicated by such terms as "middle", "up", "down", "front", "rear", "vertical", "horizontal", "top", "bottom", "inner", "outer" and the like are based on those shown in the drawings, and these terms are merely for the convenience of describing the present disclosure and simplifying the description, and are not intended to indicate or imply that the indicated device or element must have a specific orientation, or be constructed and operated in a specific orientation, and therefore cannot be interpreted as the limitation of the present disclosure.

It should be noted that, in the description of the embodiments of the present disclosure, the terms "install", "couple" and "connect" are to be interpreted broadly, unless specifically defined or limited otherwise. For example, they may refer to fixed connection, detachable connection, or integral connection. Or, they may refer to mechanical connection or electrical connection. Also, they may refer to direct connection, indirect connection through an intermediate medium, or internal communication between two elements. For a person having ordinary skills in the art, the specific meanings of the above terms in the present disclosure can be understood as the case may be.

While the embodiments of the present disclosure have been described above, those are only used to facilitate the understanding of the present disclosure, and are not intended to limit it. A person skilled in the art to which the present disclosure pertains can make any modification or change to the forms and details of implementation of the present disclosure without departing from the spirit and scope of the present disclosure, but the protection scope of the present disclosure is still based on that defined by the appended claims.

What is claimed is:

1. A method for manufacturing a display panel, comprising steps of:
    forming, on a substrate, a thin film transistor comprising a gate electrode, an active layer, a source electrode and a drain electrode;
    forming a hydrogen diffusion barrier layer that covers the entire substrate, wherein the hydrogen diffusion barrier layer is electrically conductive and is electrically connected to the drain electrode; and
    forming a photosensitive structure layer on the hydrogen diffusion barrier layer, wherein the step of forming the photosensitive structure layer on the hydrogen diffusion barrier layer comprises:
        depositing an N-type amorphous silicon thin film on the hydrogen diffusion barrier layer by adopting a plasma enhanced chemical vapor deposition process;
        depositing an intrinsic amorphous silicon thin film on the N-type amorphous silicon thin film; and
        subjecting the intrinsic amorphous silicon thin film to ion implantation, and subjecting the ion-implanted intrinsic amorphous silicon thin film to activation treatment to form a P-type amorphous silicon thin film on an upper layer of the intrinsic amorphous silicon thin film.

2. The method according to claim 1, further comprising:
    depositing a first conductive thin film on the photosensitive structure layer; and
    patterning the hydrogen diffusion barrier layer, the photosensitive structure layer and the first conductive thin film to form a photodiode consisting of a barrier electrode formed by the hydrogen diffusion barrier layer, a photosensitive structure formed by the photosensitive structure layer and a first electrode formed by the first conductive thin film.

3. The method according to claim 2, further comprising:
    forming a planarization layer after the patterning, wherein the planarization layer has a via hole that runs through the planarization layer to expose the first electrode; and
    forming, on the planarization layer, a second electrode that is electrically connected to the first electrode through the via hole.

4. The method according to claim 3, further comprising forming a light-shielding layer on the planarization layer, wherein an orthogonal projection of the light-shielding layer on the substrate covers an orthogonal projection of a channel area on the substrate.

5. The method according to claim 4, wherein the light-shielding layer and the second electrode are formed simultaneously.

6. The method according to claim 3, further comprising forming, on the second electrode, an electrode lead that is electrically connected to the second electrode.

7. The method according to claim 1, wherein the hydrogen diffusion barrier layer comprises a first material layer, a second material layer and a third material layer stacked one on another, wherein the first material layer and the third material layer comprise indium tin oxide, and the second material layer comprises silver.

8. The method according to claim 1, wherein the active layer comprises indium gallium zinc oxide or indium tin zinc oxide.

9. The method according to claim 1, wherein the step of forming the thin film transistor on the substrate comprises:
    forming, on the substrate, the gate electrode and a signal line, and a first insulating layer covering the gate electrode and the signal line;
    forming the active layer on the first insulating layer, wherein the active layer is an oxide active layer;
    forming a second insulating layer covering the oxide active layer, wherein the second insulating layer has two first via holes that run through the second insulating layer to expose the oxide active layer, and a second via hole that runs through the first insulating layer and the second insulating layer to expose the signal line;
    forming the source electrode, the drain electrode and a connecting electrode on the second insulating layer, wherein the source electrode and the drain electrode are electrically connected to the oxide active layer through the two first via holes, respectively, and the connecting electrode is electrically connected to the signal line through the second via hole; and forming a third insulating layer covering the source electrode, the drain electrode and the connecting electrode, wherein the third insulating layer has a third via hole that runs through the third insulating layer to expose the drain electrode, and a fourth via hole that runs through the third insulating layer to expose the connecting electrode.

10. The method according to claim 9, wherein the hydrogen diffusion barrier layer comprises a first material layer, a second material layer and a third material layer stacked one on another, wherein the first material layer and the third material layer comprise indium tin oxide, and the second material layer comprises silver.

11. The method according to claim 9, wherein the active layer comprises indium gallium zinc oxide or indium tin zinc oxide.

12. The method according to claim 1, wherein the step of forming the thin film transistor on the substrate comprises:
   forming, on the substrate, the gate electrode and a first insulating layer covering the gate electrode;
   forming the active layer on the first insulating layer, wherein the active layer is an oxide active layer;
   forming the source electrode and the drain electrode on the oxide active layer;
   forming a third insulating layer covering the source electrode and the drain electrode, wherein the third insulating layer has a third via hole that runs through the third insulating layer to expose the drain electrode.

13. The method according to claim 12, wherein the hydrogen diffusion barrier layer comprises a first material layer, a second material layer and a third material layer stacked one on another, wherein the first material layer and the third material layer comprise indium tin oxide, and the second material layer comprises silver.

14. The method according to claim 12, wherein the active layer comprises indium gallium zinc oxide or indium tin zinc oxide.

15. A display panel manufactured by the method according to claim 1 and configured for fingerprint identification or X-ray detection.

16. A display device, comprising the display panel according to claim 15.

17. The method according to claim 1, further comprising:
   patterning the hydrogen diffusion barrier layer to form the barrier electrode after forming the photosensitive structure layer on the hydrogen diffusion barrier layer by adopting the plasma enhanced chemical vapor deposition process.

* * * * *